United States Patent [19]

Hong

[11] Patent Number: 5,460,988
[45] Date of Patent: Oct. 24, 1995

[54] PROCESS FOR HIGH DENSITY FLASH EPROM CELL

[75] Inventor: Gary Hong, Hsin-Chu, Taiwan

[73] Assignee: United Microelectronics Corporation, Hsinchu, Taiwan

[21] Appl. No.: 231,811

[22] Filed: Apr. 25, 1994

[51] Int. Cl.$^6$ ............... H01L 21/265; H01L 21/8247
[52] U.S. Cl. .................. 437/43; 437/48; 437/52; 257/315
[58] Field of Search ................. 437/43, 48, 49, 437/52; 257/315, 316

[56] References Cited

U.S. PATENT DOCUMENTS

| | | | |
|---|---|---|---|
| 4,975,383 | 12/1990 | Baglee | 437/43 |
| 5,045,490 | 9/1991 | Esquivel et al. | 437/43 |
| 5,049,515 | 9/1991 | Tzeng | 437/43 |
| 5,071,782 | 12/1991 | Mori | 437/48 |
| 5,135,879 | 8/1992 | Richardson | 437/43 |
| 5,141,886 | 8/1992 | Mori | 437/43 |
| 5,304,503 | 4/1994 | Yoon et al. | 437/43 |

OTHER PUBLICATIONS

"High Performance CMOS Surrounding Gate Transistor (SGT) for Ultra High Density LSIs", by H. Takato et al, IEDM 1988, pp. 222–224.

Primary Examiner—Olik Chaudhuri
Assistant Examiner—Richard A. Booth
Attorney, Agent, or Firm—George O. Saile; Stephen B. Ackerman

[57] ABSTRACT

A method and structure for manufacturing a high-density EPROM or flash memory cell is described. A structure having silicon islands is formed from a device-well that has been implanted with a first conductivity-imparting dopant, over a silicon substrate. A first dielectric layer surrounds the vertical surfaces of the silicon islands, whereby the first dielectric layer is a gate oxide. A first conductive layer is formed over vertical surfaces of the first dielectric layer, and acts as the floating surrounding-gate for the memory cell. A source region is formed in the device-well by implanting with a second and opposite conductivity-imparting dopant to the first conductivity-imparting dopant, and surrounds the base of the silicon islands. A drain region is in the top of the silicon islands, formed by implanting with a second and opposite conductivity-imparting dopant to the first conductivity-imparting dopant. A thin dielectric layer surrounds the silicon islands, over the source region and under the first conductive layer, and acts as a tunnel oxide for the memory cell. A second dielectric layer is formed over vertical surfaces of the first conductive layer, and horizontally over the source region, and is an interpoly dielectric. A second conductive layer is formed over vertical surfaces of the second dielectric layer, and is the control gate for the memory cell.

8 Claims, 4 Drawing Sheets

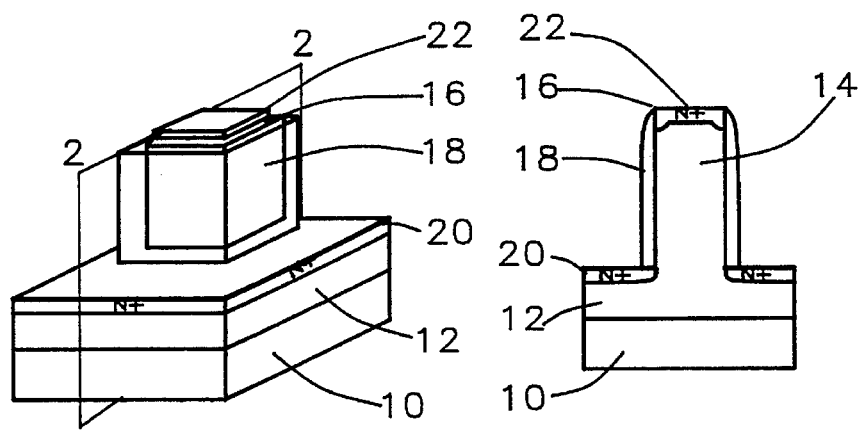
FIG. 1 – Prior Art    FIG. 2 – Prior Art
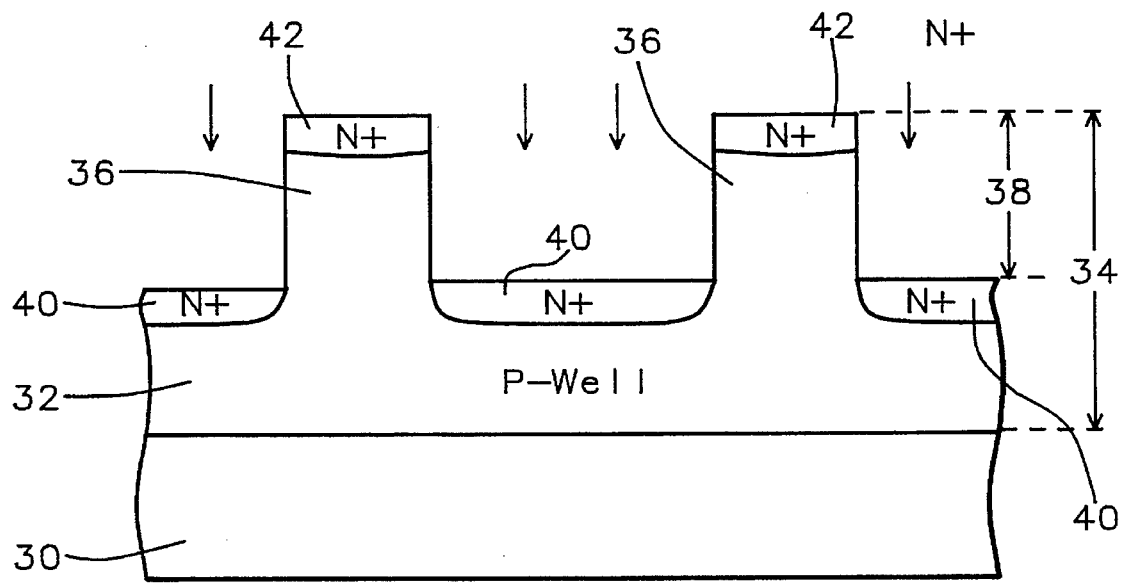
FIG. 3

PROCESS FOR HIGH DENSITY FLASH EPROM CELL

RELATED PATENT APPLICATION

Ser. No. 08/231812, filed Apr. 25, 1994, now U.S. Pat. No. 5,414,287, "Process for High Density Split-Gate Memory Cell", inventor Gary Hong.

BACKGROUND OF THE INVENTION (1) Field of the Invention

This invention relates to ROM (Read Only Memory) manufacturing techniques, and more particularly to a method and structure of manufacturing a high-density flash EPROM (Electrically Programmable Read Only Memory) cell.

(2) Description of the Related Art

ROM devices are well known and widely used in the computer technology. In general, a ROM device consists of an array of MOSFETs (Metal Oxide Semiconductor Field Effect Transistor) arranged in columns and rows where selected MOSFETs are rendered permanently conductive, or non-conductive, depending on the type of transistor. The ability to set the conductive state of each MOSFET provides a means for storing binary information, and is done typically during a manufacturing process. In a ROM device, this information is non-volatile, i.e., it is maintained even when power is removed from the circuit.

EPROM devices differ from ROMs in their ability to be programmed and erased by a user, after the manufacturing process is complete. They offer advantages such as a small single-cell structure, made of a single MOS transistor with a double-polysilicon gate, and thus high density. Programming is typically accomplished by channel hot-electron injection, outside of the circuit in which the EPROM is used, and erasing by exposure to ultraviolet light, or other means. These somewhat cumbersome techniques explain the popularity of EEPROMs (Electrically Erasable Programmable Read Only Memory), which can be erased and programmed while in-circuit, using Fowler-Nordhiem tunneling. However, EEPROMs have a large cell size and require two transistors per cell.

An EEPROM uses a floating gate structure in the MOSFET cell to provide programmability. The floating, or unconnected, gate provides a conductive surface isolated from the source and drain regions of the MOSFET by a thin gate oxide. A second conductive gate, called the control gate, is adjacent to but isolated from the floating gate. The threshold voltage characteristics of the MOSFET cell is controlled by the amount of charge on the floating gate. The amount of charge is set to one of two levels, to indicate whether the cell has been programmed "on" or "off".

The memory cell's state is "read" by applying appropriate voltages to the MOSFET source and drain, and to the control gate, and then sensing the amount of current flow through the transistor. The desired memory cell is selected by choosing the source and drain lines in the column where the cell is located, and applying the control gate voltage to the control gates in the row of the cell being addressed.

The memory cell's programmable state may be erased by removing charge from the floating gate. A fairly recent technology is "flash" memories, in which the entire array of memory cells, or a significant subset thereof, is erased simultaneously.

In the semiconductor technologies, and particularly in memory structures, there is a constant effort to reduce the lateral size of each device, thus allowing increased density of devices on the same or similar size semiconductor chip. One approach to reducing the lateral area of the device is to build a more vertical structure, as is shown in "High Performance CMOS Surrounding Gate Transistor (SGT) for Ultra High Density LSIs", by H. Takato et al, IEDM 88 pages 222–224. As shown in FIGS. 1 and 2, a vertical "silicon island" 14 is formed from a p-well region 12 formed over a silicon substrate 10. The side-walls of the island are utilized as the channel region of the device, and the conductive gate layer 18 is formed surrounding the sidewalls and separated therefrom by a thin gate oxide 16. The source 20 and drain 22 regions are formed in horizontal regions around the base of, and in the top of, respectively, the silicon island.

SUMMARY OF THE INVENTION

It is therefore an object of the invention to provide a surrounding-gate memory cell, for use in a highly dense electrically programmable read-only memory (EPROM) or flash-memory.

It is a further object of the invention to provide a self-aligned, small area for the tunnel oxide of a flash-memory or EPROM, to improve the coupling ratio and reliability of the memory device.

It is a further object of the invention to provide a method for manufacturing a surrounding-gate memory cell, for an electrically programmable read-only memory (EPROM) or flash-memory.

These objects are achieved by a structure having silicon islands formed from a device-well that has been implanted with a first conductivity-imparting dopant, over a silicon substrate. A first dielectric layer surrounds the vertical surfaces of the silicon islands, whereby the first dielectric layer is a gate oxide. A first conductive layer is formed over vertical surfaces of the first dielectric layer, and acts as the floating surrounding-gate for the memory cell. A source region is formed in the device-well by implanting with a second and opposite conductivity-imparting dopant to the first conductivity-imparting dopant, and surrounds the base of the silicon islands. A drain region is in the top of the silicon islands, formed by implanting with a second and opposite conductivity-imparting dopant to the first conductivity-imparting dopant. A thin dielectric layer surrounds the silicon islands, over the source region and under the first conductive layer, and acts as a tunnel oxide for the memory cell. A second dielectric layer is formed over vertical surfaces of the first conductive layer, and horizontally over the source region, and is an interpoly dielectric. A second conductive layer is formed over vertical surfaces of the second dielectric layer, and is the control gate for the memory cell.

These objects are further achieved by a method of manufacturing in which silicon islands are formed from a device-well implanted with a first conductivity-imparting dopant, over a silicon substrate. Source regions are formed in the device-well in the regions between the silicon islands, by implanting with a second and opposite conductivity-imparting dopant to the first conductivity-imparting dopant, and drain regions are simultaneously formed in the top of the silicon islands by the implanting with a second and opposite conductivity-imparting dopant. A first dielectric layer is formed surrounding the vertical surfaces of the silicon islands. A second dielectric layer is formed over the silicon islands and the source regions. A first conductive layer is formed over the vertical surfaces of the first dielectric layer, thereby creating the floating surrounding-gate for the memory cell. A third dielectric layer is formed over vertical surfaces of the first conductive layer, and horizontally over the source regions, thereby creating a tunnel oxide. A second conductive layer is formed over the vertical surfaces of the second dielectric layer and horizontally over the third dielectric layer, as a control gate and word line for the memory cell.

BRIEF DESCRIPTION OF THE DRAWINGS

FIGS. 1 and 2 are a three-dimensional view and cross-sectional view (taken along line 2—2 of FIG. 1), respectively, of a surrounding-gate CMOS device of the prior art.

FIGS. 3 and 4 are cross-sectional views at different process steps for the surrounding-gate memory cell of the invention.

DESCRIPTION OF THE PREFERRED EMBODIMENTS

Figure 4:
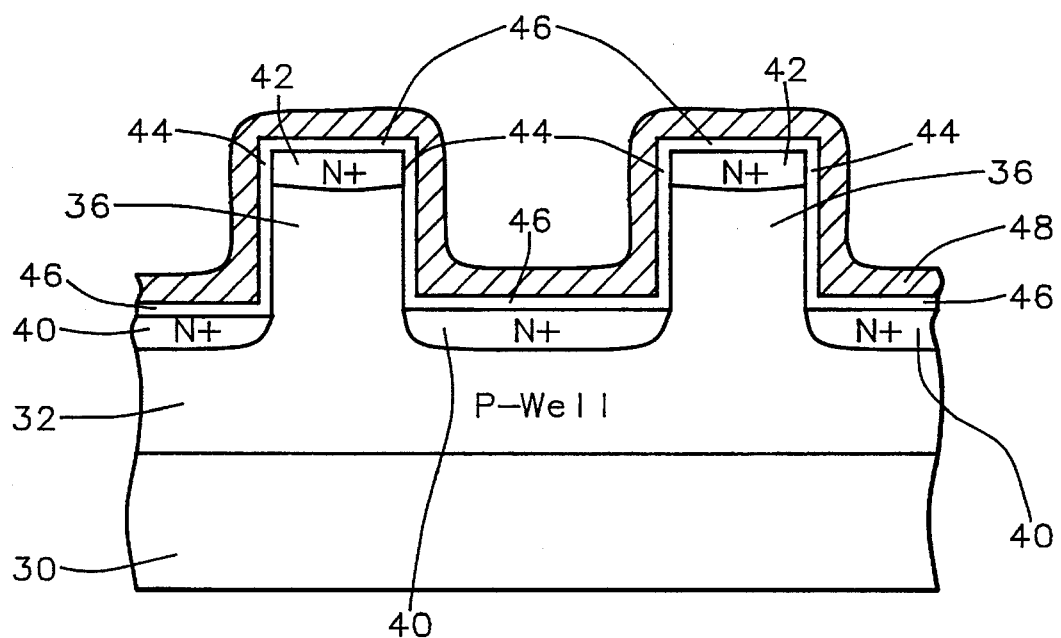

Referring now to the drawings, more particularly to FIGS. 3 through 7, there is illustrated a method and resulting structure for the novel process for producing a surrounding-gate memory cell for a flash memory or EPROM device. Referring more particularly to FIG. 3, there is illustrated a silicon substrate 30 on which a p-well structure 32 has been formed by ion-implanting with boron at an energy of between about 50 and 300 KeV., and a concentration of between about 5 E 11 and 1 E 13 atoms/cm.2. The p-well has a depth 34 of between about 1.0 and 5.0 um (micrometers). An anisotropic etch is performed to form silicon islands 36, which have a height 38 of between about 0.3 and 2.0 um. The height of the silicon islands determines the channel width of the FET device to be subsequently formed as part of the surrounding-gate memory cell. The source regions 40 and drain regions 42 are now formed by ion implantation of arsenic $AS^{75}$ at an energy of between about 30 and 100 KeV, and a concentration of between about 1 E 15 and 8 E 15 atoms/cm.2.

Referring now to FIG. 4, two oxidation steps are performed to form a gate oxide 44 on the vertical sides of silicon islands 36, and a thinner oxide 46 on the horizontal surfaces of the structure. Thermal oxide is first grown on both the vertical and horizontal surfaces to a thickness of between about 80 and 150 Angstroms by a furnace process, using a temperature of about 850 ° C. in dry O2 (oxygen) for between about 10 and 30 minutes. An anisotropic etch is performed by a plasma etcher such as an Applied Material oxide etcher 8310 mode, to remove the oxide formed on the horizontal surfaces.

A second oxide is now formed by thermal oxidation in dry O2, or O2 plus an N2O ambient, at a temperature of about 800° and 900 ° C. for between about 10 and 30 minutes. The result of these two oxidation steps and the intermediate etch is a horizontal oxide layer 46 with a thickness of between about 60 and 100 Angstroms, and a vertical gate oxide layer 44 with a thickness of between about 120 and 200 Angstroms.

A conformal deposition of polycrystalline silicon, or polysilicon, is now performed to form layer 48, to a thickness of between about 500 and 2000 Angstroms, by Low Pressure Chemical Vapor Deposition (LPCVD). The resistivity of polysilicon layer 48 is reduced by doping with POC13 (phosphorus oxychloride) at between about 800° and 950° C. for between about 10 and 20 minutes, to reduce the sheet resistance to between about 30 and 1000 ohms/square. This completes the structure shown in FIG. 4.

Figure 5:
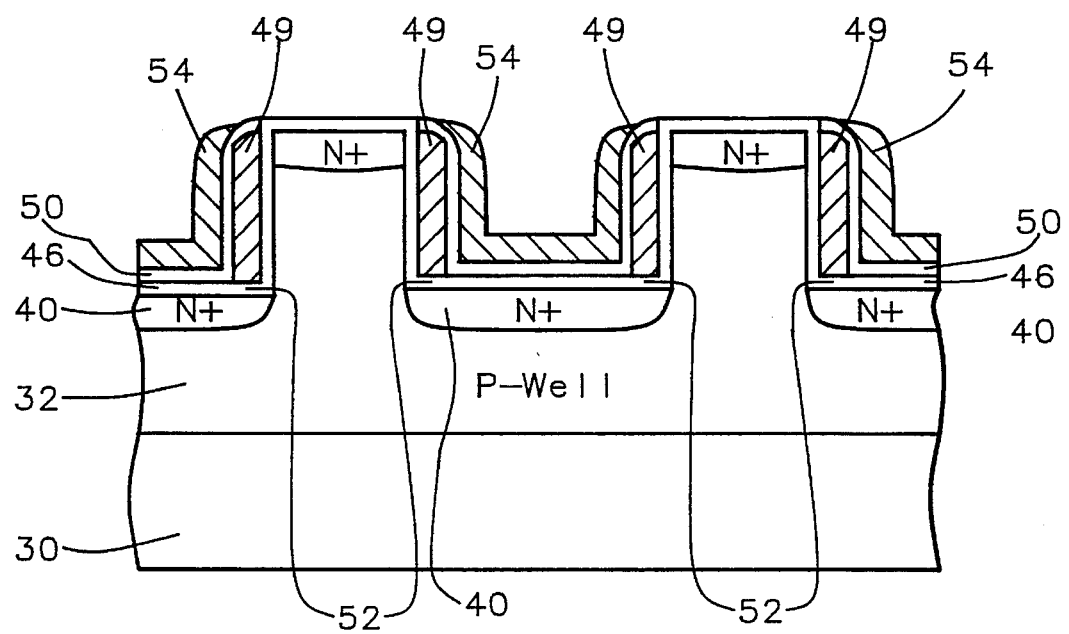
FIG. 5 is a cross-sectional view along line 5—5 of FIG. 7 for the surrounding-gate memory cell of the invention.

With reference to FIG. 5, an anisotropic etch is performed to remove those portions of polysilicon layer 48 on the horizontal surfaces of the FIG. 4 structure, by a plasma etch. The resultant structure is the floating gate 49 of the EPROM memory cell. Interpoly oxide 50 is now formed, to a thickness of between about 150 and 300 Angstroms. This layer may be a single oxide layer, as shown in FIG. 5, or a combination oxide/nitride, or, preferably, an oxide/nitride/oxide (ONO) structure. To form the ONO structure (not shown), subsequent layers of silicon oxide (SiO2), silicon nitride (Si3N4) and silicon oxide (SiO2) are formed. The first SiO2 layer is formed by thermal oxidation to a thickness of between about 50 and 150 Angstroms. The Si3N4 layer is deposited by LPCVD to a thickness of between about 60 and 200 Angstroms. The final SiO2 layer is formed by thermal oxidation, or LPCVD, to a thickness of between about 30 and 100 Angstroms.

Figure 7:
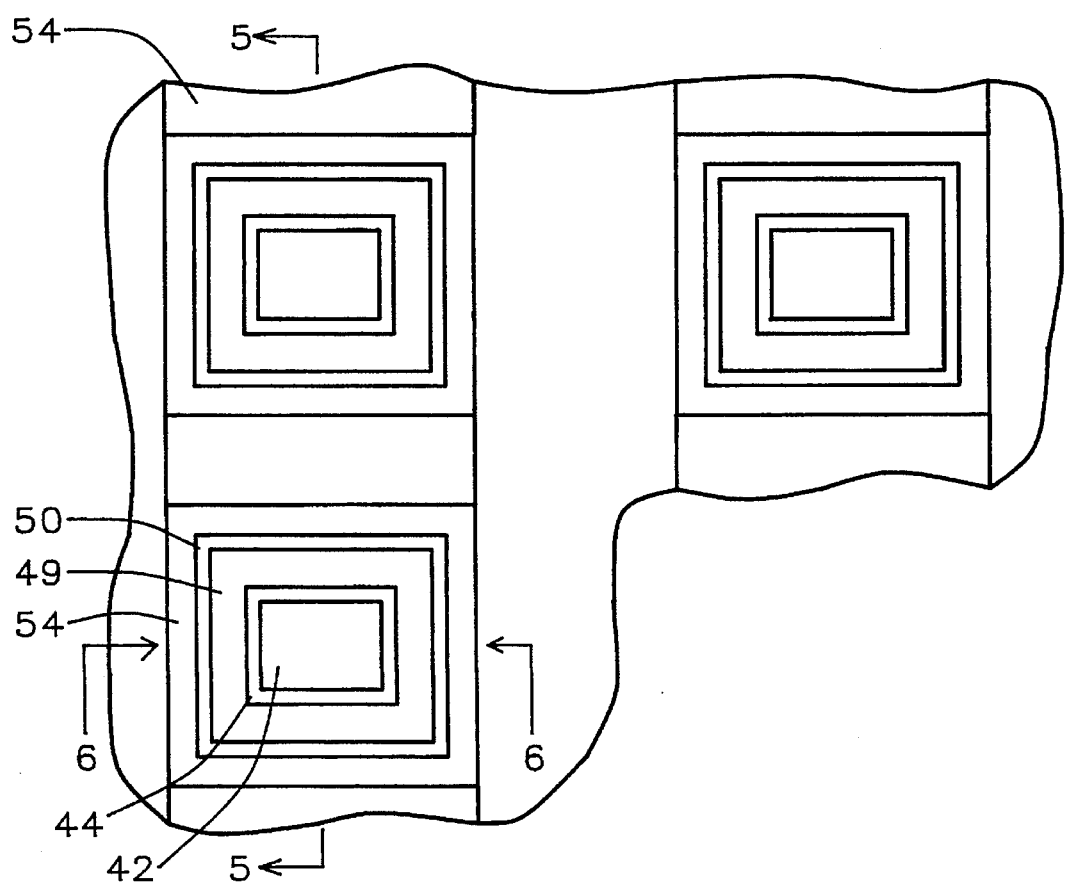
FIG. 7 is a top view of the surrounding-gate memory cell of the invention.

As can be seen in FIG. 5, there are small regions 52 in oxide layer 46, self-aligned under floating gate 49, over which dielectric 50 is not formed. These regions form the thin tunnel oxide for the memory cell. This self-aligned process forms a controllable small area of tunnel oxide. The smaller the tunnel oxide area, the better the coupling ratio of the memory cell. Moreover, the small tunnel oxide also results in better reliability (due to a smaller area and thus less defects). A second polysilicon deposition is now performed, by LPCVD, to form a layer with a thickness of between about 2000 and 4000 Angstroms. Doping is accomplished by ion-implantation with arsenic or phosphorus, at a concentration of about 1 E 16 atoms/cm2 and an energy of about 50 KeV, or by doping with $POCL_3$, as described above. An anisotropic etch is performed on this polysilicon layer to form the word lines 54 of the EPROM device. This can be seen more clearly in the top view of FIG. 7, in which it can be seen that word line 54 connects a column of cells including the two memory cells of FIG. 5 along the line 5—5 of FIG. 7. Using conventional lithography and etching, polysilicon is removed from between adjacent word lines, and from the top of silicon islands 36, as shown in FIGS. 5 and 7. Word line 54 also forms the control gate for the EPROM memory cells.

Figure 6:
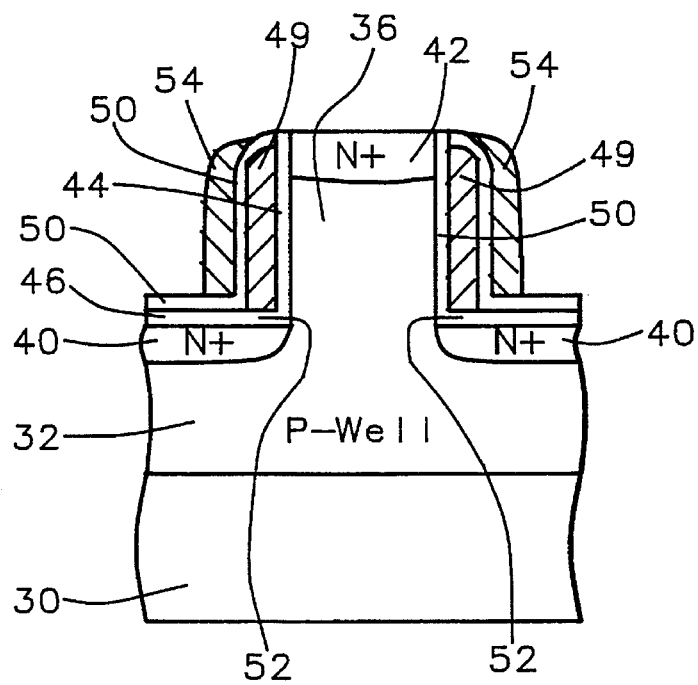
FIG. 6 is a cross-sectional view along line 6—6 of FIG. 7 for the surrounding-gate memory cell of the invention.

FIGS. 6 and 7 are different views of the completed cell structure. FIG. 7 is a top view, in which the structure shown along line 5—5 is that shown in FIG. 5, while the view along line 6—6 is the FIG. 6 structure. FIG. 6 elements are numbered to correspond to the same reference numbers as in FIG. 5.

Figure 8:
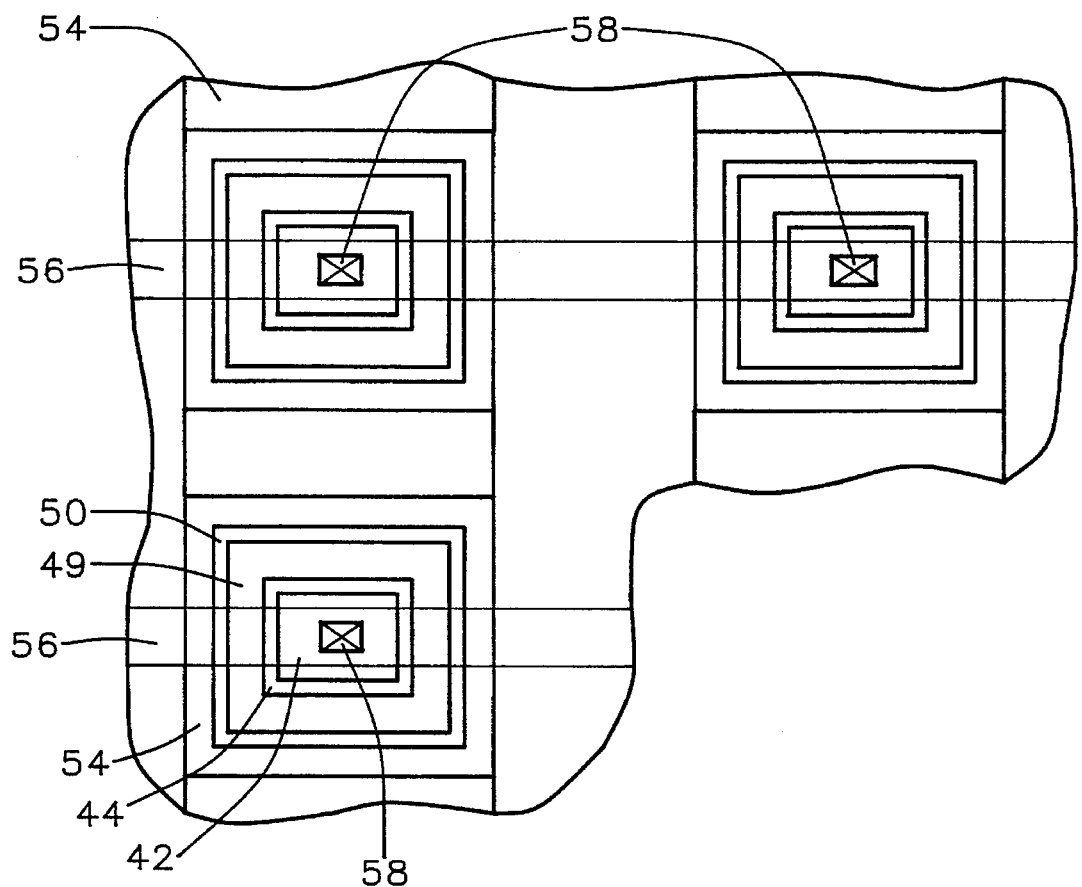
FIG. 8 is a top view of the surrounding-gate memory cell of the invention, after metallization and formation of bit lines.

Completion of the EPROM device (not shown) now proceeds as is well known in the art. The second polysilicon layer 54 is thermally oxidized to form a dielectric layer, followed by deposition of borophosphosilicate glass (BPSG), BPSG reflow to planarize its top surface, contact formation, and metallization. Referring to FIG. 8, bit lines 56 are shown and are formed of metal lines during metallization, and contact the drain regions 42 at the top of the silicon islands by contacts 58.

Operation of the EPROM is indicated in Table I below. To program the EPROM, that is, to set the charge on the floating gate to an "off" level, a voltage level of 12 volts (V) is applied to the word line of the memory cell that is desired to be programmed. A level of 6 V is applied to the memory cell drain, and 0 V to the source, so that electrons are injected into the floating gate by hot electrons from the drain area.

When it is desired to read the contents of a memory cell, a level of 3 V is applied to the word line (W/L), 1 V to the drain, and 0 V to the source. When there is charge on the floating gate, i.e., the cell is programmed, the threshold voltage VT is high (>5 V) and the cell is read as being "off". If the cell is unprogrammed, VT is low (between about 0.7 and 1.5 V) and large cell current is read (between about 50 and 200 microamps) and the cell is read as being "on". Large cell current is one of the advantages of the invention using the surrounding cell structure.

To erase the cell contents, 0 V is applied at the word line, the drain is left to "float", that is, as if unconnected, and the source is set to 12 V. The entire array, or a large sector of the array, is erased at the same time, for a "flash" memory.

TABLE I

| Operation | Control gate (W/L) | Drain | Source |
| --- | --- | --- | --- |
| Program | 12 V | 6 V | 0 |
| Erase | 0 | floating | 12 V |
| Read | 3 V | 1 V | 0 |

The source regions are connected together on the bottom area of the memory cell, unless separate source areas are desired for sector erase operations. The source area is large so that contact to the source (not shown) is not critical and can be anywhere on the array.

Advantages of the invention include the self-aligned tunnel oxide with a small area, and the density improvement due to the surrounding gate structure. The small tunnel oxide area provides a better coupling ratio, resulting in lower voltage program and erase operations. The tunnel oxide area is more controllable, which enhances VT distribution during erase operations. And the smaller area provides improved reliability.

The surrounding gate structure reduces the area of each memory cell, thus allowing for increased density memories. This structure also provides a high read current.

While the invention has been particularly shown and described with reference to the preferred embodiments thereof, it will be understood by those skilled in the art that various changes in form and details may be made without departing from the spirit and scope of the invention.

What is claimed is:

1. A method of forming a floating surrounding-gate memory cell, for an electrically programmable read-only memory (EPROM) or flash-memory, comprising the steps of:

forming a well in a silicon substrate by implantation of a first conductivity type dopant;

forming silicon mesas from said well, by anisotropically etching portions of said device-well, wherein said mesas remain at the unetched portions of said device-well;

forming source regions in said device-well in the regions between said silicon mesas, by implanting with a second and opposite conductivity type dopant to said first conductivity type dopant, and simultaneously forming drain regions in the top of said silicon mesas by said implanting with a second and opposite conductivity type dopant;

forming a first oxide layer over horizontal and vertical surfaces of said silicon mesas and over said source regions;

anisotropically etching said first oxide layer to remove said first oxide layer from all said horizontal surfaces;

forming a second oxide layer over said silicon mesas, said first oxide layer and said source regions, whereby a gate oxide is formed along said vertical surfaces of said silicon mesas, and a tunnel oxide that is thinner than said gate oxide is formed over said source regions;

forming a first conductive layer over said gate oxide, thereby creating said surrounding-gate for said floating memory cell;

forming an interpoly dielectric layer over the vertical surfaces of said first conductive layer, and horizontally over said source regions; and forming a second conductive layer over said interpoly dielectric layer, which acts as a control gate and word line for said memory cell.

2. The method of claim 1 wherein said first oxide layer vertical surfaces of said silicon islands and over said is formed by thermal oxidation at a temperature of about 850° C. for between about 10 to 30 minutes and said second oxide layer is formed by thermal oxidation at a temperature of between about 800 and 900° C. for between about 10 to 30 minutes, resulting in a thickness of said gate oxide of between about 120 to 200 Angstroms, and a thickness of said tunnel oxide of between about 60 to 100 Angstroms.

3. The method of claim 1, wherein said silicon mesas are formed to a height of between about 0.3 to 2.0 micrometers.

4. The method of claim 1, wherein said first conductive layer is formed of doped polycrystalline silicon.

5. The method of claim 1, wherein said source and drain regions are doped with arsenic at a concentration of between about 1 E 15 to 8 E 15 atoms/cm$^2$.

6. The method of claim 1, wherein said interpoly dielectric layer is formed to a thickness of between about 150 to 300 Angstroms.

7. The method of claim 1, wherein said forming a second oxide layer comprises the steps of:

forming a first layer of silicon oxide, adjacent to said first conductive layer, to a thickness of between about 50 and 150 Angstroms;

forming a layer of silicon nitride, over said first layer of silicon oxide, to a thickness of between about 60 to 200 Angstroms; and forming a second layer of silicon oxide, over said layer of silicon nitride, to a thickness of between about 30 to 100 Angstroms.

8. The method of claim 1, wherein said second conductive layer is formed of doped polycrystalline silicon, and is formed to a thickness of between about 2000 to 4000 Angstroms.

* * * * *